United States Patent [19]
Ohishi

[11] Patent Number: 5,812,716
[45] Date of Patent: *Sep. 22, 1998

[54] OPTICAL MODULE AND A TEMPERATURE CONTROL METHOD THEREFOR

[75] Inventor: Isamu Ohishi, Yokohama, Japan

[73] Assignee: The Furukawa Electric Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 782,208

[22] Filed: Jan. 21, 1997

[30] Foreign Application Priority Data

Jan. 31, 1996 [JP] Japan .................................. 8-015167

[51] Int. Cl.⁶ ...................................................... G02B 6/36
[52] U.S. Cl. ................................ 385/92; 385/37; 385/89
[58] Field of Search ................................ 385/88–94, 37

[56] References Cited

U.S. PATENT DOCUMENTS

| | | | |
|---|---|---|---|
| 5,142,595 | 8/1992 | Chester | 385/89 |
| 5,222,170 | 6/1993 | Bargar et al. | 385/88 |
| 5,561,675 | 10/1996 | Bayon et al. | 385/37 |

OTHER PUBLICATIONS

B.J. Ainslie; "Photosensitive Fibre and Planar Waveguides"; MOC (Micro Optics Conference) 1995 Hiroshima, pp. 238–241.

*Primary Examiner*—John Ngo
*Attorney, Agent, or Firm*—Frishauf, Holtz, Goodman, Langer & Chick

[57] ABSTRACT

An optical module and a temperature control method therefor, wherein the optical module includes a light-emitting device, an optical waveguide, a cooling device for cooling the light-emitting device, and a package for containing the light-emitting device, one end portion of the optical waveguide and the cooling device, and wherein the light-emitting device and the optical waveguide are optically coupled to each other. The optical waveguide has a grating section formed at the one end portion contained in the package for selectively reflecting only light with a fixed wavelength, and the cooling device cools the grating section in addition to the light-emitting device.

19 Claims, 2 Drawing Sheets

OPTICAL MODULE AND A TEMPERATURE CONTROL METHOD THEREFOR

BACKGROUND OF THE INVENTION

1. Field of the Invention

The present invention relates to an optical module in which light-emitting device such as a semiconductor laser is optically coupled to an optical waveguide having a part thereof formed as a grating section, and to a temperature control method for controlling a temperature of such an optical module.

2. Description of the Related Art

Generally, in light-emitting devices, for example, in a semiconductor laser (hereinafter merely referred to as an "LD") for oscillating a single-mode laser beam, the LD has a distributed feedback structure incorporated therein or a cavity (resonator) is situated outside the LD at the back of the same as viewed in the direction of propagation of emitted light.

Also known is an optical module with a fixed oscillation wavelength, wherein an optical waveguide having a grating section, for example, an optical grating fiber, is optically coupled to the front of an LD as viewed in the direction of propagation of light from the LD. The grating section denotes a portion of the core of an optical fiber which extends for about several millimeters in the lengthwise direction and which has a different refractive index at predetermined intervals to permit only selected light with a certain wavelength to be partially reflected.

It is conventionally known that the life of an LD shortens due to heat generated thereby and that the oscillating property of the laser beam changes with age. Therefore, in an optical module provided with an LD, a cooling device is arranged near the LD to absorb heat generated thereby so that the life of the LD may be prolonged and the oscillation condition stabilized.

However, no matter how satisfactorily temperature control is performed, if the operating current of the LD changes for some reason, the oscillation condition also varies, causing a change of the oscillation wavelength of the emitted laser beam. In the optical module provided with an LD, therefore, to prevent the changing of oscillation wavelength due to variation in the oscillation condition, an optical fiber having a grating section is optically coupled to the front of the LD, as mentioned above, so that a grating section may function as an external cavity (resonator), to thereby stabilize the oscillation wavelength.

Up to the present, it has been generally considered that, in the optical module in which an optical fiber having a grating section is optically coupled to an LD, a stable oscillation wavelength could theoretically be obtained by controlling only the temperature of the LD itself, and not that of the grating section of the optical fiber as well.

The optical module described above employs, for example, a method wherein a grating plate is used as an external resonator, and a variable-wavelength light source has been put to practical use in which the grating plate is positively tilted with respect to the optical path to thereby vary the resonance wavelength. With this method, however, since the position of the grating plate can be spatially displaced relative to the LD, it is difficult to achieve resonance while the wavelength is fixed at a certain wavelength.

On the other hand, in the optical module in which an optical waveguide having a grating section is arranged at the front of an LD, the characteristics of the grating section are affected by the ambient temperature. As a result, a problem arises in that the resonance wavelength of the optical module undergoes a variation of approximately 0.05 nm/°C., for example, making the oscillation wavelength of the LD unstable.

SUMMARY OF THE INVENTION

An object of the present invention is to provide an optical module capable of stabilizing the oscillation wavelength of the without entailing an increase in manufacturing cost, and to provide a temperature control method for controlling a temperature of the optical module.

To achieve the object, the present invention provides an optical module including a light-emitting device, an optical waveguide, a cooling device for cooling the light-emitting device, and a package for containing the light-emitting device, one end portion of the optical waveguide and the cooling device, the light-emitting device and the optical waveguide being optically coupled to each other, wherein the optical waveguide has a grating section formed at the one end portion thereof contained in the package for selectively reflecting only light with a fixed wavelength, and the cooling device cools the grating section in addition to the light-emitting device.

To achieve the above object, there is also provided according to the present invention a temperature control method for an optical module including a light-emitting device, an optical waveguide, a cooling device for cooling the light-emitting device, and a package for containing the light-emitting device, one end portion of the optical waveguide and the cooling device, the light-emitting device and the optical waveguide being optically coupled to each other, wherein the temperature control method comprises containing the light-emitting device, a grating section of the optical waveguide and the cooling device in the package, and permitting light emitted from the light-emitting device to enter the one end portion of the optical waveguide while cooling the light-emitting device and the grating section.

With this arrangement, both the light-emitting device (LD) and the grating section of the optical waveguide are cooled and thus the temperature of the optical module is controlled to a proper temperature, whereby not only the life of the LD is prolonged but also the oscillation condition of the LD as well as the characteristics of the grating section are stabilized. Consequently, the oscillation wavelength of the optical module can be stabilized with extremely high accuracy. Also, since the arrangement is simple, it is possible to provide low-cost optical modules.

Preferably, the light-emitting device is a semiconductor laser.

Also, the optical waveguide preferably comprises a planar optical waveguide or an optical fiber.

The optical fiber preferably has a lens section at an extreme end thereof.

Preferably, the cooling device is a Peltier device.

Also, the package preferably has a guide section for the optical waveguide and has the interior thereof kept airtight by a filler filled in the guide section.

Further preferably, the package is made of an Fe—Ni—Co alloy (Ni 29 wt %; Co 17 wt %; Fe 54 wt %).

In an optical module using an optical fiber as the optical waveguide, the optical fiber must be positioned by means of a V-groove cut in the base plate. The formation of the V-groove in the base plate correspondingly increases the labor in the fabrication of the optical module.

On the other hand, in the case of the optical module using a planar optical waveguide as the optical waveguide, the base plate and a waveguide member having a planar optical waveguide formed thereon can be positioned in a plane. Therefore, the optical module according to the present invention using a planar waveguide as the optical waveguide can be fabricated very easily as compared with the optical module using an optical fiber as the optical waveguide.

Where an optical fiber having a lens section at its extreme end is used as the optical waveguide, the optical waveguide can advantageously receive with high efficiency the light emitted from the LD.

In the optical module and the temperature control method therefor according to the present invention, the light-emitting device and the grating section of the optical waveguide are cooled for temperature control, whereby not only the life of the light-emitting device is prolonged but also the oscillation condition of the light-emitting device as well as the characteristics of the grating section are stabilized. Consequently, the oscillation wavelength of the optical module can be stabilized with extremely high accuracy. Also, since an external cavity (resonator) with which the oscillation wavelength is difficult to adjust and fix at a target wavelength is not used, it is possible to provide low-cost optical modules. Further, by adjusting the characteristics of the grating section, it is possible to adjust the spectral width of the oscillation wavelength.

The above and other objects, features and advantages of the present invention will become more apparent from the following detailed description when taken in conjunction with the accompanying drawings.

DETAILED DESCRIPTION OF THE PREFERRED EMBODIMENTS

Figure 1:
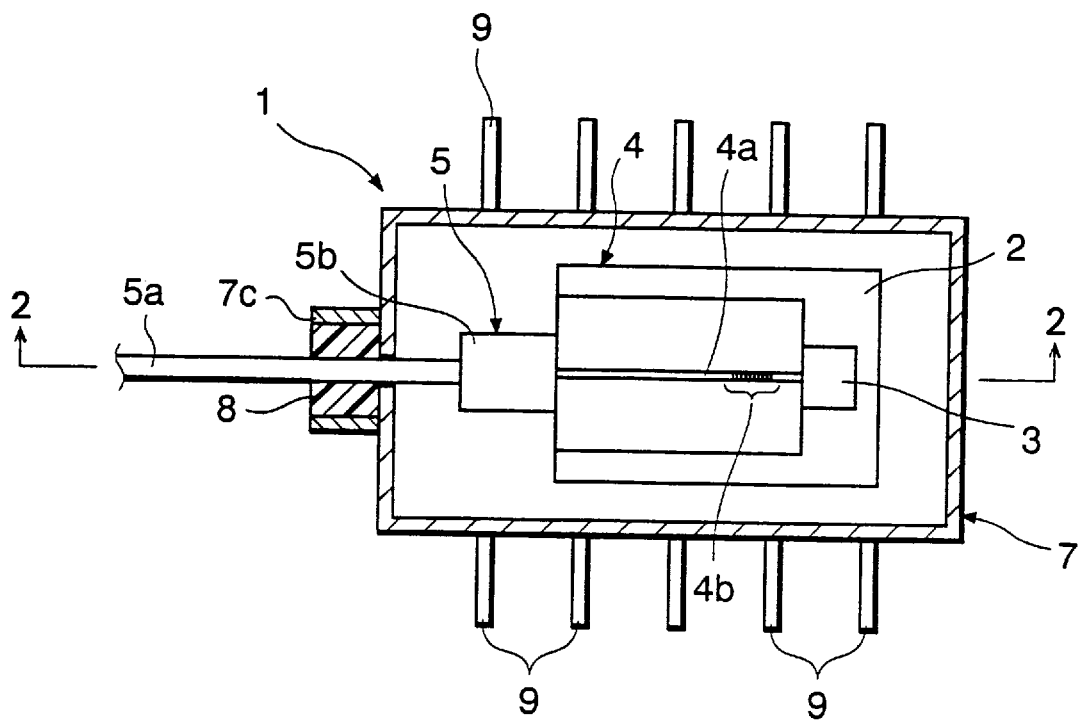
FIG. 1 is a plan view of an optical module according to one embodiment of the present invention.
Figure 2:
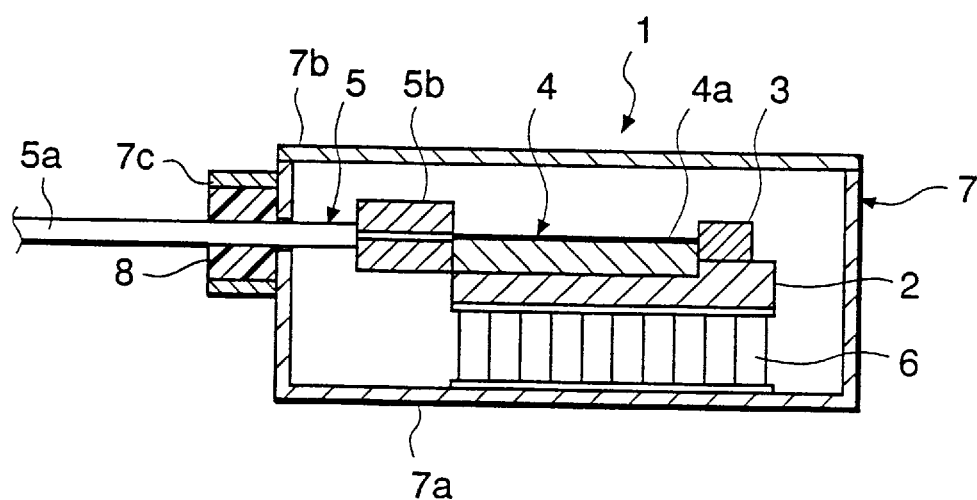
FIG. 2 is a sectional view of the optical module taken along line 2—2 in FIG. 1.

Embodiments of the present invention will be now described in detail with reference to the drawings.
First Embodiment FIGS. 1 and 2 illustrate an optical module 1 according to a first embodiment of the present invention.

The optical module 1 comprises a base plate 2, an LD 3, a waveguide member 4, an optical fiber block 5, a cooling device 6, and a package 7.

The base plate 2 is made of ceramic material, copper or the like and is placed on the cooling device 6. The LD 3 is arranged on one side of the base plate 2.

The waveguide member 4 has a planar optical waveguide (hereinafter merely referred to as "optical waveguide") 4a formed on its upper surface. As shown in FIG. 1, the optical waveguide 4a has a grating section 4b formed at its one end portion close to the LD 3. The waveguide member 4 is securely fixed, together with the LD 3, to the base plate 2 by solder, adhesive or the like, with the optical axis of the optical waveguide 4a aligned with that of the LD 3. Therefore, the LD 3 and the waveguide member 4 are formed so that when fixed on the base plate 2, the guide layer (or guide section) of the LD 3 place a level on the optical waveguide 4a. In order to facilitate the dissipation of heat generated by the LD 3, the LD 3 is placed on the base plate 2 with a heatsink, a carrier or the like interposed therebetween, but this is not shown in FIGS. 2, 3 and 5.

The grating section 4b is a portion of the optical waveguide 4a where the refractive index is recurrently varied at predetermined intervals in the longitudinal direction of the optical waveguide 4a, for example, at intervals corresponding to ½ of the wavelength of light transmitted through the optical waveguide 4a and an optical fiber cord 5a, mentioned later, and has a total length of about several millimeters. Accordingly, the grating section 4b partially reflect only selected light with a given wavelength, by means of the diffraction of light transmitted through the optical waveguide 4a.

For example, to form the optical waveguide 4a with such a grating section 4b, a method is generally employed wherein the optical waveguide 4a which has been subjected to high-pressure hydrogenation is irradiated with an ultraviolet laser beam, such as an excimer laser beam, so that a part of the optical waveguide 4a, more concretely, a length of about several millimeters of the optical waveguide 4a, may have a different refractive index. To form a grating section in an optical fiber 13 used in a second embodiment of the present invention, described later, the optical fiber 13b is first subjected to high-pressure hydrogenation, and then is irradiated with an ultraviolet laser beam such as an excimer laser beam, as in the above case, so that the refractive index of the optical fiber 13 may be changed for a length of several millimeters in the lengthwise direction.

The optical fiber block 5 comprises a ferrule 5b to which an end of a single optical fiber cord 5a is attached. The ferrule 5b is securely fixed to the waveguide member 4 by adhesive, solder or the like, with the optical axis of the optical fiber cord 5a aligned with the optical axis of the optical waveguide 4a. As such adhesive, heat-hardening adhesive, ultraviolet-curing adhesive or the like may be used.

The cooling device 6 comprises a Peltier device and incorporates therein a thermistor etc. for temperature control, not shown. There are no particular restrictions on the cooling device 6 to be used, and any desired device may be used insofar as it can cool the LD 3 and the grating section 4b for temperature control.

The package 7 is made of an Fe—Ni—Co alloy (Ni 29 wt %; Co 17 wt %; Fe 54 wt %), for example, and has a body 7a and a cover 7b. The body 7a of the package 7 has a guide section 7c formed thereon for allowing the optical fiber cord 5a to be extended outside, and a filler 8 is filled in the space defined between the guide section 7c and the optical fiber cord 5a to keep the interior of the package 7 airtight. As the filler 8, epoxy resin etc. can be used. Methods currently employed to hermetically fix the optical fiber cord 5a to the package 7 include a method wherein the optical fiber cord 5a, of which a part exposed by removing the jacket has been coated with metal, is directly hermetically fixed to the package 7 by solder, or a method wherein the metal-coated part of the optical fiber is fixed by solder to a ferrule made of metal, which in turn is fixed to the package by solder.

In FIG. 1, reference numeral 9 represents leads connected to the LD 3 and the cooling device 6 for supplying power thereto, and to the temperature control thermistor, not shown.

The optical module 1 having the arrangement described above is fabricated in the following manner.

First, the LD 3 and the waveguide member 4 are set in position on the base plate 2 and fixed thereto by solder, adhesive or the like in such a manner that the optical axes of the LD 3 and the optical waveguide 4a are aligned with each other.

Then, the ferrule 5b is abutted against the left-hand end of the waveguide member 4 as viewed in FIGS. 1 and 2, and with the optical axis of the optical fiber cord 5a aligned with that of the optical waveguide 4a, the optical fiber block 5 is firmly secured to the waveguide member 4 by adhesive, solder or the like.

Subsequently, the base plate 2, on which the LD 3, the waveguide member 4 and the ferrule 5b are secured as described above, is firmly bonded by solder or an adhesive having excellent heat conductivity onto the cooling device 6, which is in advance securely fixed inside the package body 7a by solder, an adhesive or the like.

The optical fiber cord 5a is then extended to the outside of the package 7 through the guide section 7c, and the filler 8 is filled in the guide section 7c.

Finally, using resistance welding or the like, the upper opening of the package body 7a is hermetically closed with the cover 7b made of metal, thereby obtaining the optical module 1 of which the interior of the package 7 is kept airtight.

Thus, while the optical module 1 is in use, the LD 3 as well as the grating section 4b of the waveguide member 4 can be cooled by the cooling device 6 for temperature control. Consequently, not only the life of the LD 3 is prolonged, but also the oscillation condition of the LD 3 is stabilized. Also, since the characteristics of the grating section 4b are stable, the oscillation wavelength of the optical module 1 can be stabilized with extremely high accuracy, and it is possible to provide low-cost optical modules.

Second Embodiment

Figure 3:
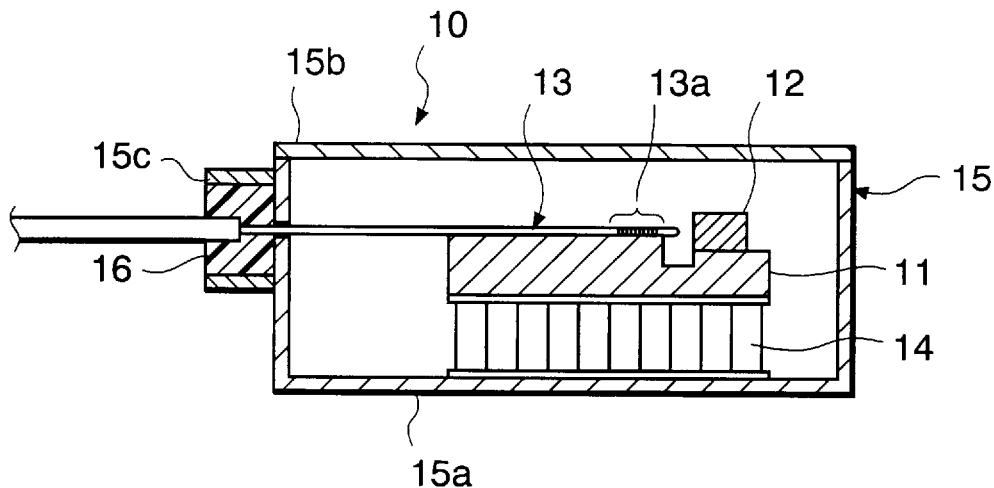
FIG. 3 is a vertical sectional view showing another embodiment of the present invention.
Figure 4:
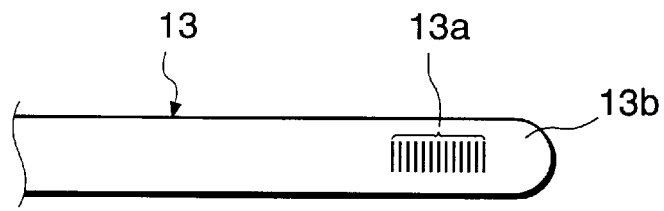
FIG. 4 is an enlarged view of an end portion of an optical fiber shown in FIG. 3.

Referring now to FIGS. 3 and 4, an optical module 10 according to a second embodiment of the present invention will be described.

The optical module 10 comprises a base plate 11, an LD 12, an optical fiber 13, a cooling device 14, and a package 15.

This optical module 10 is identical in arrangement with the optical module 1 of the first embodiment, except that the optical module 10 uses the optical fiber 13 in place of the waveguide member 4. Therefore, explanation of those component parts of the optical module 10 which are identical with the corresponding ones of the optical module 1 is omitted.

The optical module 10 of the second embodiment is fabricated in the following manner.

First, using the aforementioned method, the grating section 13a is formed in the vicinity of an extreme end of the optical fiber 13 for a length of about several millimeters in the longitudinal direction, and then the extreme end of the optical fiber 13 is heated and melted to form a lens section 13b, shown in FIG. 4, by utilizing the surface tension. By forming the lens section 13b at the extreme end of the optical fiber 13, the optical fiber 13 can receive light from the LD 12 with increased efficiency.

The method of forming the lens section 13b is not limited to the one mentioned above; for example, the lens section 13b of the optical fiber 13 may be formed by an etching process which utilizes the difference in composition between the core and the cladding, not shown.

Then, the LD 12 and the optical fiber 13 are set in respective predetermined positions on the base plate 11 and are securely fixed thereto by solder, adhesive or the like.

Subsequently, the base plate 11, on which the LD 12 and the optical fiber 13 are secured as described above, is firmly bonded by solder or an adhesive having excellent heat conductivity onto the cooling device 14, which is in advance securely fixed inside the package body 15a by solder, an adhesive or the like.

The optical fiber 13 is then extended to the outside of the package 15 through the guide section 15c, and the filler 16 is filled in the guide section 15c.

Finally, using resistance welding or the like, the upper opening of the package body 15a is hermetically closed with the cover 15b made of metal, thereby obtaining the optical module 10 of which the interior of the package 15 is kept airtight.

Thus, the optical module 10 has advantageous effects similar to those of the optical module 1.

In the second embodiment, an ordinary single-mode optical fiber is used as the optical fiber 13; however, the optical fiber to be used is not limited to the single-mode optical fiber and various other types of optical fibers can of course be used. Also, an optical fiber with no lens section can of course be used in the present invention.

Recently, there has been a demand for an increase of the output of transmission signal-light to 10 mW or higher.

It is difficult to directly modulate such high-output signal light and oscillate single-mode signal-light while at the same time suppressing variation of the oscillation wavelength. If, however, the optical waveguide having the grating section as described above is used, the LD is capable of so-called single-mode oscillation because the oscillation waveband of the LD is narrow.

Figure 5:
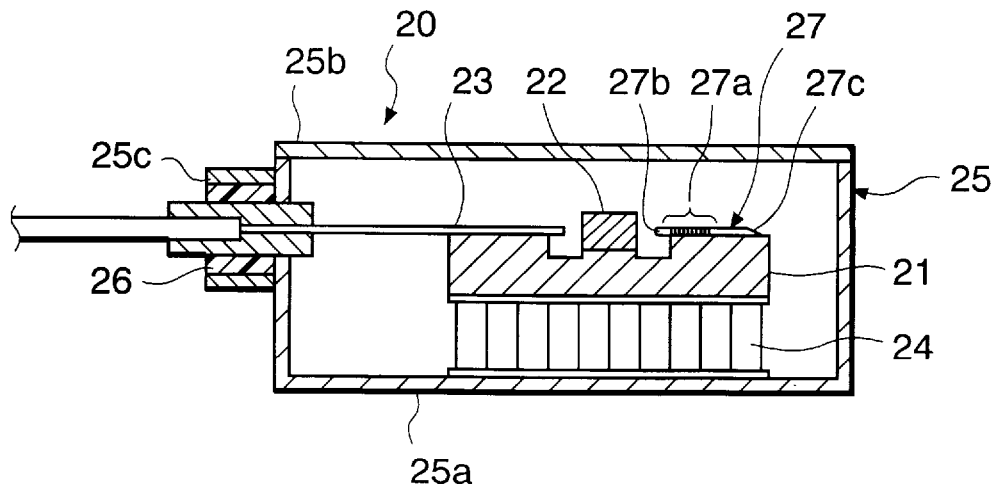
FIG. 5 is a sectional view of an optical module which employs a distributed Bragg reflection type LD using an external resonator.

Accordingly, the LD may be a distributed Bragg reflection type using an external resonator instead of the distributed feedback technique which is generally employed to achieve single-mode oscillation. For example, as shown in FIG. 5, an optical waveguide 27 having a grating section 27a may be used as the external resonator and optically coupled to an LD 22 to obtain an optical module 20.

The optical waveguide 27 comprises an optical fiber, which has a lens section 27b formed at an end thereof close to the LD 22 and has a non-reflecting section 27c formed by obliquely cutting the other end. In FIG. 5, reference numeral 21 denotes the base plate, 23 denotes the optical fiber, 24 denotes the cooling device, 25 denotes the package, and 26 denotes the filler. Since these elements are substantially identical with the corresponding ones of the preceding embodiments, detailed description thereof is omitted.

What is claimed is:

1. An optical module comprising:

a light-emitting device, an optical waveguide having a core and a cladding, a cooling device for cooling the light-emitting device, and a package for containing the light-emitting device, one end portion of the optical waveguide and the cooling device, wherein the light-emitting device and the one end portion of the optical waveguide contained in the package are optically coupled to each other, wherein the optical waveguide has a grating section formed in the core at the one end portion thereof contained in the package in a direction of an optical axis of the core, said grating section selectively reflecting only light with a fixed wavelength, and wherein the cooling device cools the grating section in addition to the light-emitting device.

2. The optical module according to claim 1, wherein the light-emitting device comprises a semiconductor laser.

3. The optical module according to claim 1, wherein the optical waveguide comprises a planar optical waveguide.

4. The optical module according to claim 2, wherein the optical waveguide comprises a planar optical waveguide.

5. The optical module according to claim 1, wherein the optical waveguide comprises an optical fiber.

6. The optical module according to claim 5, wherein the optical fiber has a lens section at an extreme end thereof.

7. The optical module according to claim 1, wherein the cooling device comprises a Peltier device.

8. The optical module according to claim 4, wherein the cooling device comprises a Peltier device.

9. The optical module according to claim 6, wherein the cooling device comprises a Peltier device.

10. The optical module according to claim 2, wherein the package has a guide section for the optical waveguide and has an interior thereof kept airtight by a filler filled in the guide section.

11. The optical module according to claim 4, wherein the package has a guide section for the optical waveguide and has an interior thereof kept airtight by a filler filled in the guide section.

12. The optical module according to claim 6, wherein the package has a guide section for the optical waveguide and has an interior thereof kept airtight by a filler filled in the guide section.

13. The optical module according to claim 10, wherein the package comprises an Fe—Ni—Co alloy.

14. The optical module according to claim 11, wherein the package comprises an Fe—Ni—Co alloy.

15. The optical module according to claim 12, wherein the package comprises an Fe—Ni—Co alloy.

16. A temperature control method for controlling a temperature of an optical module, said optical module comprising:

a light-emitting device, an optical waveguide having a core and a cladding, a cooling device for cooling the light-emitting device, and a package for containing the light-emitting device, one end portion of the optical waveguide and the cooling device, wherein the light-emitting device and the one end portion of the optical waveguide contained in the package are optically coupled to each other, and said temperature control method comprising:

forming a grating section in the core at the one end portion of the optical waveguide contained in the package in a direction of an optical axis of the core, and permitting light emitted from the light-emitting device to enter the one end portion of the optical waveguide contained in the package while cooling the light-emitting device and the grating section.

17. An optical module comprising:

a light-emitting device, an optical waveguide, a cooling device for cooling the light-emitting device, and a package for containing the light-emitting device, one end portion of the optical waveguide and the cooling device, wherein the light-emitting device and the optical waveguide are optically coupled to each other, wherein the optical waveguide has a grating section formed at the one end portion thereof contained in the package for selectively reflecting only light with a fixed wavelength, wherein the cooling device cools the grating section in addition to the light-emitting device, wherein the light-emitting device comprises a semiconductor laser, wherein the package has a guide section for the optical waveguide and has an interior thereof kept airtight by a filler filled in the guide section, and wherein the package comprises an Fe—Ni—Co alloy.

18. The optical module according to claim 17, wherein the optical waveguide comprises a planar optical waveguide.

19. An optical module comprising:

a light-emitting device, an optical waveguide, a cooling device for cooling the light-emitting device, and a package for containing the light-emitting device, one end portion of the optical waveguide and the cooling device, wherein the light-emitting device and the optical waveguide are optically coupled to each other, wherein the optical waveguide has a grating section formed at the one end portion thereof contained in the package for selectively reflecting only light with a fixed wavelength, wherein the cooling device cools the grating section in addition to the light-emitting device, wherein the optical waveguide comprises an optical fiber, wherein the optical fiber has a lens section at an extreme end thereof, wherein the package has a guide section for the optical waveguide and has an interior thereof kept airtight by a filler filled in the guide section, and wherein the package comprises an Fe—Ni—Co alloy.

* * * * *